(12) United States Patent
Kim et al.

(10) Patent No.: US 9,069,257 B2
(45) Date of Patent: *Jun. 30, 2015

(54) MASK AND OPTICAL FILTER MANUFACTURING APPARATUS INCLUDING THE SAME

(75) Inventors: Sin Young Kim, Daejeon (KR); Kyung Ki Hong, Chungcheongbukdo (KR); Hyuk Yoon, Gwangmyeong-si (KR); Won Cheul Ju, Chungcheongbuk-do (KR); Yong Il Cho, Goyang-si (KR); Moon Soo Park, Daejeon (KR); Dong Ho Ko, Cheongju-si (KR); Su Young Ryu, Daejeon (KR)

(73) Assignee: LG CHEM, LTD., Seoul (KR)

( * ) Notice: Subject to any disclaimer, the term of this patent is extended or adjusted under 35 U.S.C. 154(b) by 107 days.

This patent is subject to a terminal disclaimer.

(21) Appl. No.: 13/393,522

(22) PCT Filed: Jul. 26, 2011

(86) PCT No.: PCT/KR2011/005514
§ 371 (c)(1),
(2), (4) Date: Aug. 9, 2012

(87) PCT Pub. No.: WO2012/015229
PCT Pub. Date: Feb. 2, 2012

(65) Prior Publication Data
US 2013/0114055 A1 May 9, 2013

(30) Foreign Application Priority Data

Jul. 26, 2010 (KR) .......................... 10-2010-0072018
Sep. 15, 2010 (KR) .......................... 10-2010-0090604

(51) Int. Cl.
*G02F 1/1337* (2006.01)
*G03B 27/02* (2006.01)
(Continued)

(52) U.S. Cl.
CPC ............ *G03F 1/42* (2013.01); *G02F 1/133753* (2013.01); *G02B 5/201* (2013.01);
(Continued)

(58) Field of Classification Search
CPC .......... B29C 71/00; G02B 5/30; G02B 5/201; G02F 1/16; G02F 1/42; G02F 1/1303; G02F 1/1337; G02F 1/133753; G02F 1/133788; G03F 7/00; G03F 7/7035; G03F 7/70566
USPC ............. 349/92, 94, 123, 124, 129, 134, 187; 355/67, 71, 77, 78, 84
See application file for complete search history.

(56) References Cited

U.S. PATENT DOCUMENTS 6,844,913 B2 * 1/2005 Leidig .............................. 355/2
2006/0166111 A1 * 7/2006 Umetsu et al. ..................... 430/5
(Continued)

FOREIGN PATENT DOCUMENTS

CN 101324750 12/2008
JP 08-248618 A 9/1996
(Continued)

*Primary Examiner* — Colin Kreutzer
(74) *Attorney, Agent, or Firm* — McKenna Long & Aldridge LLP

(57) ABSTRACT

A mask and an optical filter manufacturing apparatus having the same are provided. The optical filter manufacturing apparatus includes a roll used in a roll-to-roll process, a base film wound around the roll, a light source that generates light for exposure, a polarizing plate that is installed at an emission side of the light source and polarizes light generated from the light source, and a mask that causes a pattern to be formed on the base film and includes a plurality of guide slits that are opened to have a predetermined thickness and a predetermined width. According to the present invention, the entire surface of the base film can be irradiated with a uniform light quantity. Thus, a pattern can be uniformly formed on the base film, the quality of a product can be improved, and the characteristics of the base film can be accurately realized.

10 Claims, 8 Drawing Sheets

(51) Int. Cl.
*G03B 27/10* (2006.01)
*G03B 27/72* (2006.01)
*G03F 1/42* (2012.01)
*G02B 5/20* (2006.01)
*G02F 1/13* (2006.01)
*G03F 7/00* (2006.01)
*G03F 7/24* (2006.01)

(52) U.S. Cl.
CPC ............. *G03B 27/72* (2013.01); *G02F 1/1303* (2013.01); *G02F 1/133788* (2013.01); *G03F 7/0007* (2013.01); *G03F 7/24* (2013.01)

(56) References Cited

U.S. PATENT DOCUMENTS

2007/0273818 A1* 11/2007 Yoshida et al. ............... 349/128
2009/0256086 A1* 10/2009 Hakoi et al. ............... 250/492.1
2009/0268186 A1* 10/2009 Mino et al. ..................... 355/70
2010/0208190 A1* 8/2010 Yoshida ....................... 349/160
2012/0092742 A1* 4/2012 Kim et al. ..................... 359/227
2013/0143007 A1* 6/2013 Kim et al. .................... 428/195.1
2013/0301026 A1* 11/2013 Shin et al. ....................... 355/71

FOREIGN PATENT DOCUMENTS

| JP | 10-153707 A | 6/1998 |
| JP | 2001-159713 A | 6/2001 |
| JP | 2005-033179 A | 2/2005 |
| JP | 2006-201273 A | 8/2006 |
| JP | 2006-201538 A | 8/2006 |
| JP | 2006-293197 A | 10/2006 |
| JP | 2008-116514 A | 5/2008 |
| JP | 2009-145539 A | 7/2009 |
| TW | 200632542 | 9/2006 |
| TW | 200846835 | 12/2008 |
| WO | 2008-129712 A1 | 10/2008 |

* cited by examiner

MASK AND OPTICAL FILTER MANUFACTURING APPARATUS INCLUDING THE SAME

This application is a National Phase Application of International Patent Application No. PCT/KR2011/005514, filed on Jul. 26, 2011, which claims priority to and the benefit of Korean Patent Application Nos. 10-2010-0072018, filed on Jul. 26, 2010 and 10-2010-0090604, filed on Sep. 15, 2010, which are incorporated by reference in their entirety herein.

CROSS-REFERENCE TO RELATED APPLICATION

Background

1. Field of the Invention

The present invention relates to an optical filter manufacturing apparatus, and more particularly, to a mask used for optically aligning an alignment film of a liquid crystal display (LCD) device or an alignment film of an optical base film that uses a curable liquid crystal using a polarization element in a roll-to-roll process and an optical filter manufacturing apparatus having the mask.

2. Discussion of Related Art

In recent years, an optical alignment technique of aligning an alignment film by irradiating it with polarized light having certain wavelengths has been widely used as a technique of giving alignment performance to an alignment film of a liquid crystal display (LCD) device or a viewing angle compensation base film layer. Conventionally, in a polarized light irradiation apparatus for an optical alignment film, a technique of combining a rod-shaped lamp, which is a linear light source, with a wire grid polarization element has been used. This is disclosed, for example, in Korean Patent Publication Nos. 2006-0053117 and 2009-0112546.

In this optical alignment technique, as the size of a liquid crystal (LC) panel increases, a light irradiation area of a light irradiation apparatus for irradiating an optical alignment film with polarized light increases. Thus, higher illuminance is required.

In order to irradiate such a large area with high illuminance, the size of a light source of the light irradiation apparatus needs to increase to the same extent. However, since the direction of polarized light influencing alignment depends on an incident angle of incident light, when the size of the light source is large, an incident angle to the light irradiation area becomes irregular, and thus a polarizing axis becomes irregular. As a result, alignment directions of irradiated areas are not uniform, and alignment is performed in an undesired direction.

In a roll-to-roll process, a light irradiation area mostly has a curved surface. In this case, as the irradiation areas increases, irregularity of the polarizing axis within the light irradiation area is caused due to the curved surface increases.

In order to obtain a large uniform polarization distribution, a polarization element needs be irradiated with light parallelized with a high degree of accuracy. However, a large-scale device is used in producing light parallelized with a high degree of accuracy so as to cope with a large area. In the case of the large-scale device, as the length of an optical path inside the device increases, intensity of light is lowered, and a processing time increase, thus decreasing productivity. That is, it is difficult to produce parallel light having an optical characteristic without the large-scale device. In conclusion, it is difficult to perform the roll-to-roll process, and productivity is significantly lowered.

SUMMARY OF THE INVENTION

The present invention is directed to providing a mask and an optical filter manufacturing apparatus having the same which are capable of performing uniform exposure on a large area, irradiating light parallelized with a high degree of accuracy, giving uniform alignment performance, and effectively performing large-area optical alignment.

The present invention is also directed to providing a mask and an optical filter manufacturing apparatus having the same which are capable of improving uniformity of a pattern and increasing straightness of light through a simple configuration in a high-speed roll-to-roll process.

The present invention is not limited to the above-mentioned embodiments, and thus other embodiments which are not described will be clearly understood by those of ordinary skill in the art from the following description.

One aspect of the present invention provides a mask used in a roll-to-roll process for forming a pattern on a base film, including a plurality of guide slits that are opened to have a predetermined thickness and a predetermined width.

The guide slit may be designed to satisfy the following equation:

$$t \geq 5a$$

where t represents the thickness of the guide slit, and $0 < a \leq 50$ mm

The guide slit is designed to satisfy the following equation:

$$b = \frac{wa}{t} \leq 1/5 \text{ of unit pixel width}$$

where t represents the thickness of the guide slit, and a represent an interval between the mask and the base film.

An inner wall of the guide slit may have a width that decreases downward.

An inner wall of the guide slit may be coated with a total reflection material so as to increase straightness of light.

The guide slits may be arranged in plural rows at predetermined intervals.

The guide slits positioned in different rows may be alternately arranged.

Another aspect of the present invention provides an optical filter manufacturing apparatus, including: a roll used in a roll-to-roll process; a base film wound around the roll; a light source that generates light for exposure; a polarizing plate that is installed at an emission side of the light source and polarizes light generated from the light source; and a mask that causes a pattern to be formed on the base film and includes a plurality of guide slits that are opened to have a predetermined thickness and a predetermined width.

The optical filter manufacturing apparatus may further include a light collecting plate that collects light to cause an entire area of the base film to be uniformly irradiated with light.

The light source may include a short arc type discharge lamp.

The light source may include an ultraviolet (UV) lamp, and a cooling device may be installed between the UV lamp and the base film.

A plurality of light sources may be arranged in plural rows such that the light sources arranged in different rows partially overlap each other.

The light sources arranged in different rows may overlap each other by ⅔.

DETAILED DESCRIPTION OF EXEMPLARY EMBODIMENTS

Hereinafter, a mask and an optical filter manufacturing apparatus having the same according to exemplary embodiments of the present invention will be described in detail with reference to the accompanying drawings.

Figure 1:
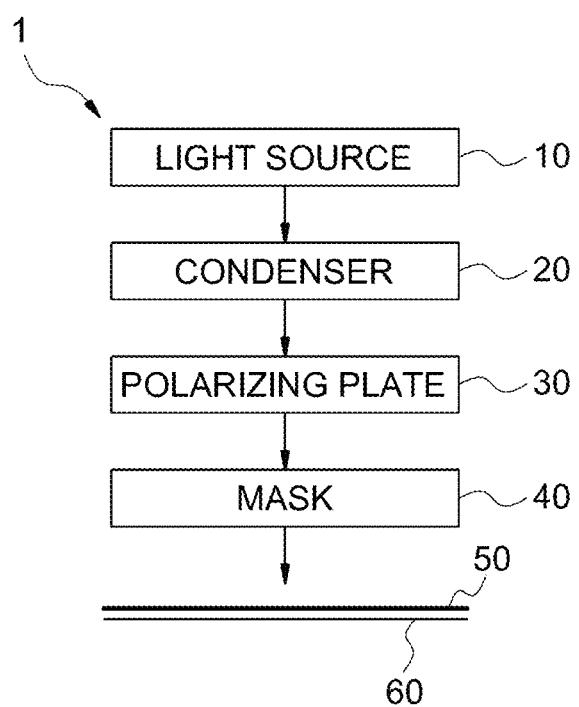
FIG. 1 illustrates an optical filter manufacturing apparatus according to an exemplary embodiment of the present invention.

Referring to FIG. 1, an optical filter manufacturing apparatus 1 according to the present invention includes a light source 10 that emits light for light exposure, a light collecting plate 20 that collects light so that light can be uniformly irradiated to the entire area of a base film 50, a polarizing plate 30 installed at an emission side of the light source 10, and a mask 40 that forms a pattern on the base film 50 as a light irradiation apparatus. Light emitted from the light source 10 is irradiated to the base film 50 wound around a roll 60 in the roll-to-roll process. These components will be described below in detail with the accompanying drawings.

The light source 10 gives an alignment characteristic and emits straight light. As will be described later, in the process of irradiating the base film 50 with light through the mask 40, as an interval between the mask 40 and the roll 60 increases, it is more difficult to form a pattern accurately and uniformly. Further, as the interval between the mask 40 and the roll 60 increases, a pattern width becomes non-uniform, and a stain is easily generated on the base film 50. Thus, in the present embodiment, the light source 10 that emits straight light is used.

Of course, as will be described later, if a design is made so that the interval between the mask 40 and the roll 60 can be maintained constant, a light source that emits straight light need not necessarily be used as the light source 10. For example, a light source that dispersedly emits light such as a rod-shaped lamp or a high-pressure mercury polymerization lamp may be used as the light source 10. However, if the interval between the mask 40 and the roll 60 is not minimized to within a predetermined distance, a pattern is non-uniformly formed. Thus, it is preferable to use straight light.

A short arc type discharge lamp, which is a sort of ultraviolet (UV) lamp, may be used as the light source 10 that emits straight light. If a discharge lamp other than the short arc type discharge lamp, such as a high pressure mercury lamp, is used, light is omnidirectionally dispersed. If light is not irradiated to the base film 50 in a vertical direction, when it is desired to form different alignments between small areas, alignment directions of respective areas become different from each other. Use of straight light irradiated in a vertical direction at the time of irradiation of polarized light is an important factor for deciding whether or not the mask 40 is to closely adhere to the base film and a boundary between small areas. Thus, when the short arc type discharge lamp is used, there is a margin in the interval between the mask 40 and the base film 50, and also the light source 10 has a greater light quantity than the high pressure mercury lamp, so that productivity is improved in the case of line working.

For example, a medium/high pressure mercury UV lamp, a metal halide lamp, and a gallium UV lamp, which are classified according to an emission wavelength, may be used as the UV curing lamp. Typically, the high pressure mercury UV lamp having illuminance of about 100 mW/cm$^2$ or more is used when curing a liquid crystal or an alignment film. Further, a cold mirror or a cooling device may be installed between the base film and the UV lamp so that the surface temperature of the LC layer can be maintained within an LC temperature range when UV light is irradiated.

In the case of the usually used high pressure mercury lamp, high-purity mercury and an inert gas are sealed in a light-emitting tube made of quartz glass, 365 nm is used as a main wavelength, and light is omnidirectionally dispersed according to a lamp type. Additionally, a lamp (straight light lamp) having an elliptical or cylindrical light collecting mirror disposed on a cross section for reflecting light from the lamp may be used instead of the rod-shaped lamp. Further, a plurality of light emitting diodes (LEDs) may be used the light source 10.

Meanwhile, according to a conventional art, a plurality of light sources are arranged in a width direction and arranged, in plural rows, in parallel along a moving direction of the base film. In this case, due to the difference in the light quantity, an alignment direction may change, or a stripe-like strain may be generated.

Figure 2:
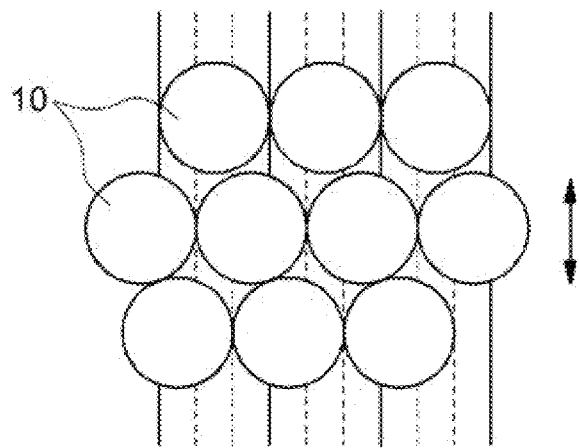
FIG. 2 illustrates an arrangement of light sources according to an exemplary embodiment of the present invention.

In this regard, according to the present embodiment, the light sources 10 are arranged so that the light sources 10 positioned in different rows can overlap each other as illustrated in FIG. 2. Thus, it is possible to prevent the occurrence of strain caused by light quantity irregularity and optical axis irregularity. Preferably, the light sources 10 positioned in different rows overlap each other by about ⅔ as illustrated in FIG. 2. However, the present invention is not limited thereto, and the light sources 10 positioned in different rows can overlap each other at various ratios, for example, by ½.

The light collecting plate 20 is installed to cause the base film 50 to be irradiated with a uniform light quantity. Even when the discharge lamp is used as the light source 10, light quantity irregularity may be caused in a portion irradiated with light due to a lamp hat of the discharge lamp. In other words, since a quantity of light which is first reflected by the lamp hat and then irradiated to the base film 50 is different from a quantity of light irradiated directly to the base film 50, a pattern becomes non-uniform. In order to solve this problem, the light collecting plate 20 is installed in front of the light source 10 to thereby cause light to be uniformly irradiated to the entire area of the base film 50.

The polarizing plate 30 is installed for polarization. Typically, a glass plate, a wire grid polarizing plate, or the like arranged at the Brewster's angle may be used as the polarizing plate 30.

Figure 3:
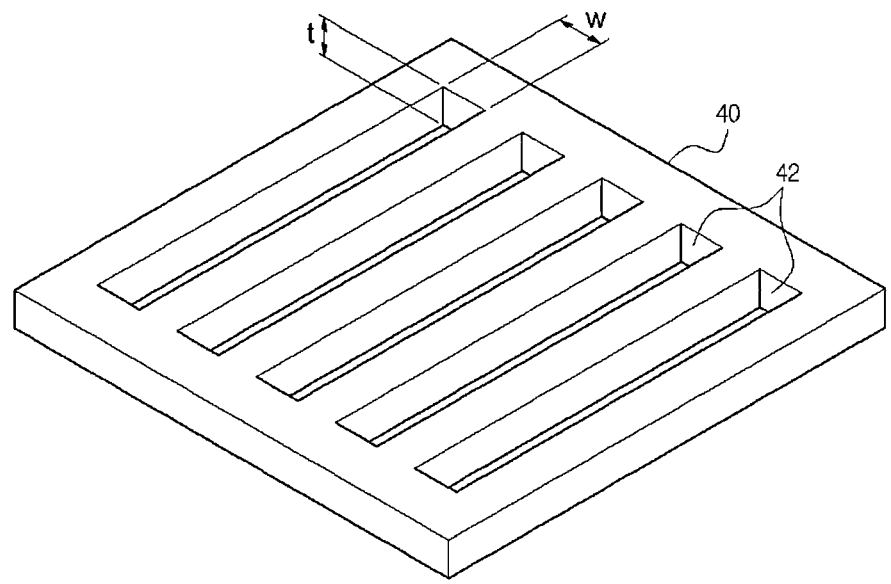
FIG. 3 illustrates a mask according to an exemplary embodiment of the present invention.

Next, referring to FIG. 3, a mask according to the present invention includes a plurality of guide slits 42, which are opened at a predetermined thickness. The guide slits 42 are formed in parallel along one side of the mask 40. The guide slits 42 increase straightness of light and thus improve uniformity of the pattern.

Specifically, in the roll-to-roll process, the base film 50 is conveyed by a belt moving along the curved surface thereof at the time of light exposure for pattern formation. When a pattern is actually formed in the roll-to-roll process, the base film 20 and the mask 10 for pattern formation move with a predetermined interval therebetween. Polarized light is not accurately irradiated to a desired position due to the interval between the mask 10 and the base film 20, so that a degree of pattern accuracy is lowered.

Further, when an optical filter is manufactured using a mask, the mask 10 is positioned apart from the base film 20 on which an alignment film is formed. In this case, irradiated polarized light may be dispersed between the mask 10 and the base film 20. Thus, it is difficult to irradiate the whole desired area with polarized light of uniform intensity. As a result, a boundary of an alignment film pattern becomes vague, and a non-aligned area in which alignment is not formed occurs in a boundary interface between a first light alignment area and a second light alignment area.

In order to solve this problem, in the present embodiment, the guide slits 42 are formed in the mask 40. Since the guide slits 42 are formed, straightness of irradiated light is improved, and uniformity of a pattern formed on the base film 50 increases. That is, straightness of light can be improved even in a state in which the mask 40 is a predetermined interval from the base film 50.

Figure 4:
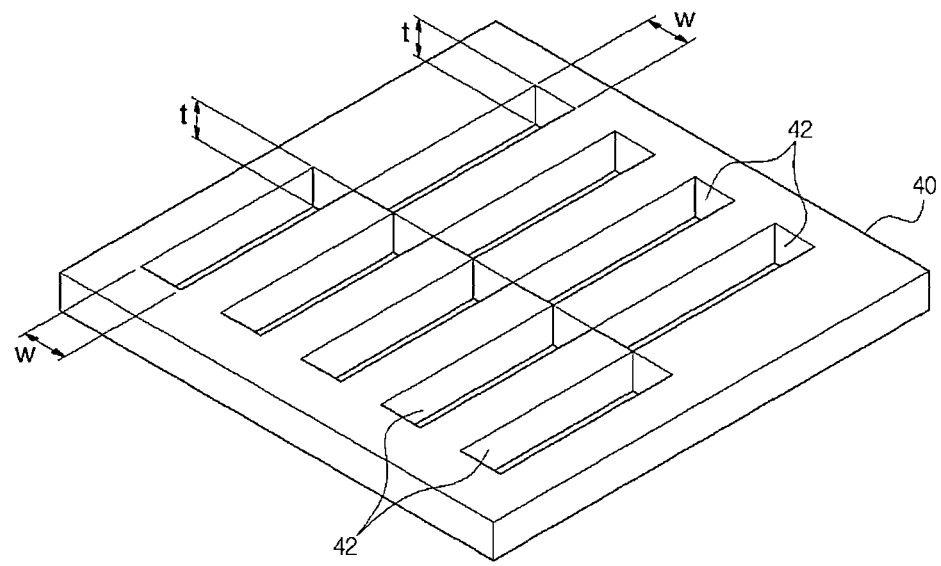
FIG. 4 illustrates a mask according to an exemplary embodiment of the present invention.

Meanwhile, the guide slits 42 illustrated in FIG. 3 may be arranged in plural rows as well as in one row. The guide slits 42 arranged in plural rows may be alternately arranged so as to form various patterns. For example, as illustrated in FIG. 4, the guide slits 42 may be arranged such that a portion of a first row where the guide slit 42 is formed may be placed on the same extension line as a portion of a second row where the guide slit 42 is not formed.

Here, in order to improve straightness of light and make a uniform pattern, it is important to appropriately design a thickness t and a width w of the guide slit 42 and an interval a between the mask 40 and the base film 50 (hereinafter referred to as "interval a"). Specifically, when exposure is performed in a state in which the mask 40 is attached to the base film 50, a decrement in the thickness t of the guide slit 42 is not problematic. However, when a pattern is formed in the roll-to-roll process, the interval a is inevitable, and when the thickness t of the guide slit 42 is relatively large, a pattern can be formed even though the interval a is relatively large.

That is, when the thickness t of the guide slit 42 is large, a pattern can be formed even if the interval a is large to some extent. However, when the thickness t of the guide slit 42 is excessively large, light transmittance and a light quantity decrease, and thus alignment is hardly obtained. Thus, it is necessary to appropriately design the thickness t of the guide slit 42.

Figure 5:
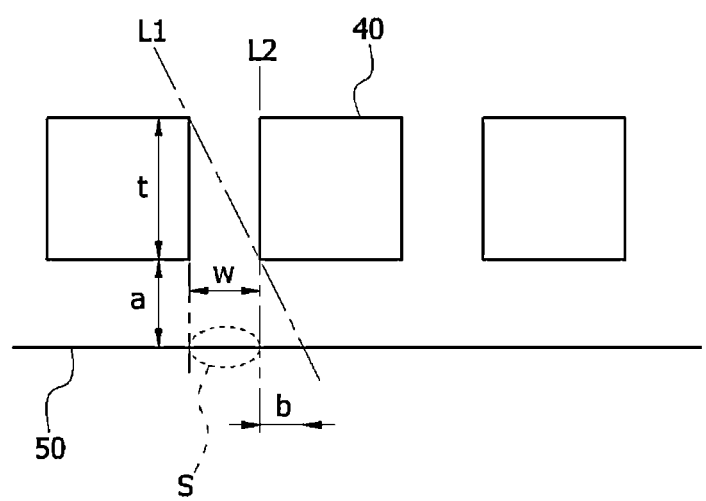
FIG. 5 is a configuration diagram illustrating a relation between a thickness and a width of a guide slit of a mask and an interval between the guide slit and a base film according to an exemplary embodiment of the present invention.

FIG. 5 is a configuration diagram illustrating a relation between the thickness and the width of the guide slit of the mask according to the present invention and the interval between the guide slit and the base film.

Referring to FIG. 5, the thickness t and the width w of the guide slit 42 and the interval a between the guide slit 42 and the base film 50 are illustrated. Here, a line diagonally extending from an upper one side of the guide slit 42 to a lower one side thereof is defined as a first reference line L1. Specifically, the first reference line L1 is a line extending from an upper left end of the guide slit 42 to a lower right end thereof. Further, a line extending along one side of the guide slit 42 is defined as a second reference line L2.

A distance between points at which the first reference line L1 and the second reference line L2 meet the base film 50 is defined as a maximum deviation distance b as illustrated in FIG. 5. The maximum deviation distance b refers to a maximum distance by which light having passed through the guide slit 42 deviates from a straight path and is irradiated to the base film 50. All light should pass through the guide slit 42 in parallel to the side of the guide slit 42 and then be irradiated to a pattern area S of the base film 50, but it is necessary to consider a case in which light is irradiated to an area outside the pattern area S like the first reference line L1 due to characteristics of the roll-to-roll process.

For this reason, in the present embodiment, by minimizing a range of light irradiated to an area other than an area in which a pattern is normally formed, a pattern is uniformly formed. To this end, as a result of deriving a design specification, the maximum deviation distance b is preferably a fifth (⅕) or less of a unit pixel width of a stereoscopic video display device. This is because when the maximum deviation distance b is larger than a fifth of a unit pixel width, crosstalk (generation of an undesired signal of a channel caused by an electric signal of another channel) is greatly generated. The above described design conditions may be represented by the following Equations.

First, a proportional equation derived using the positional relation of FIG. 5 can be represented by Equation 1:

$$t:w=(t+a):(w+b) \qquad \text{Equation 1.}$$

When Equation 1 is rearranged centering on the maximum deviation distance b, the maximum deviation distance b can be represented by Equation 2:

$$b = \frac{a}{t} * w. \qquad \text{Equation 2}$$

A relation between the maximum deviation distance b and the unit pixel width derived from Equation 2 can be represented by Equation 3:

$$b = \frac{wa}{t} \leq 1/5 \text{ of unit pixel width.} \qquad \text{Equation 3}$$

If the maximum deviation distance b calculated by setting the thickness t and the width w of the guide slit 42 and the interval a according to Equation 3 and assigning the set values to Equation 3 is a fifth (⅕) or less of a unit pixel width, it can be regarded as possible to form a pattern on the base film 50 without characteristic deterioration.

Here, since the unit pixel width is substantially the same as the width w of the guide slit 12, Equation 3 can be rearranged as in Equation 4:

$$\frac{a}{t} \leq \frac{1}{5}.$$ Equation 4

Here, when Equation 4 is rearranged again centering on "t," "t" can be ultimately represented by Equation 5:

$$t \geq 5a$$ Equation 5.

Here, the interval a is preferably designed within a range of 0<a≤50 mm. This is because it is difficult to form a normal pattern when the interval a is designed to deviate from this range. The interval a may be designed to have a value of 0.001 mm, 0.01 mm, 0.1 mm, 1 mm or more or a value of 40 mm, 30 mm, 20 mm or less and may be designed to have a value obtained by various combinations of the upper limit and the lower limit.

Figure 6A:
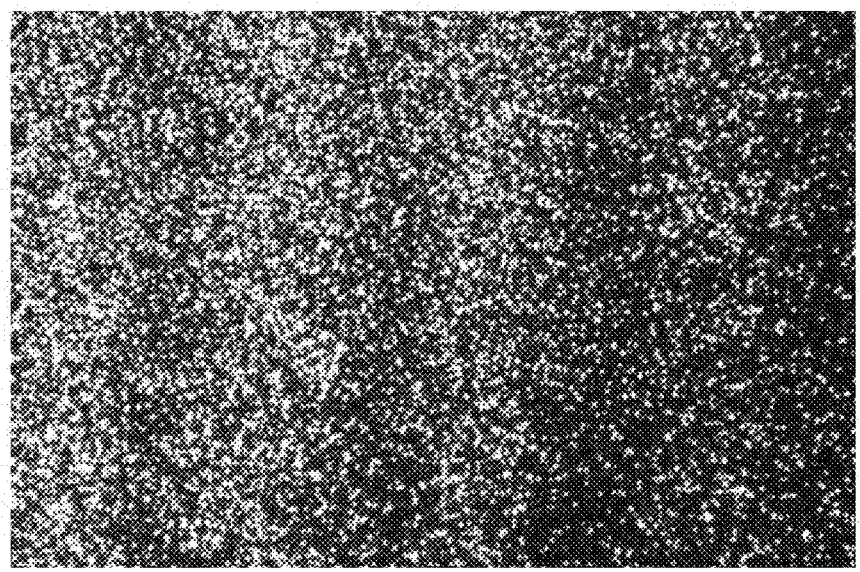
FIG. 6A is a photograph illustrating a pattern form when a guide slit is not formed in a mask.
Figure 6B:
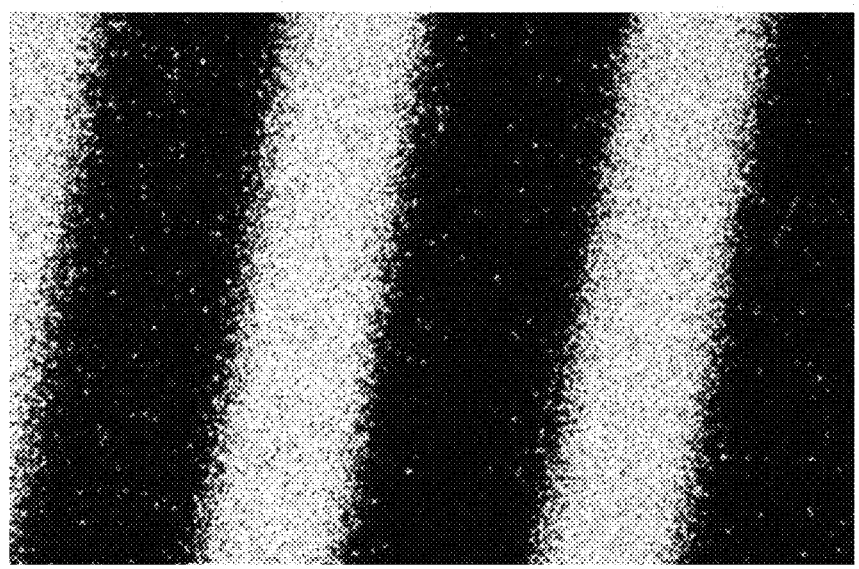
FIG. 6B is a photograph illustrating a pattern form when a guide slit is formed in a mask.

FIG. 6A is a photograph illustrating a pattern form when the guide slit is not formed in the mask, and FIG. 6B is a photograph illustrating a pattern form when the guide slit is formed in the mask.

As can be seen from FIGS. 6A and 6B, compared to when the guide slit is not formed in the mask (FIG. 6A), when the guide slit is formed in the mask (FIG. 6B) under the same condition (the interval between the mask and the base film is the same), a pattern is clearly and uniformly formed. Thus, it can be understood from FIGS. 6A and 6B that the guide slit formed in the mask used in the roll-to-roll process greatly contributes to improving uniformity of a pattern.

FIGS. 7A to 7D are photographs illustrating pattern forms according to the interval between the mask and the base film when the guide slit is formed. The interval between the mask 40 and the base film 50 increases in order in FIGS. 7A to 7D.

Figure 7A:
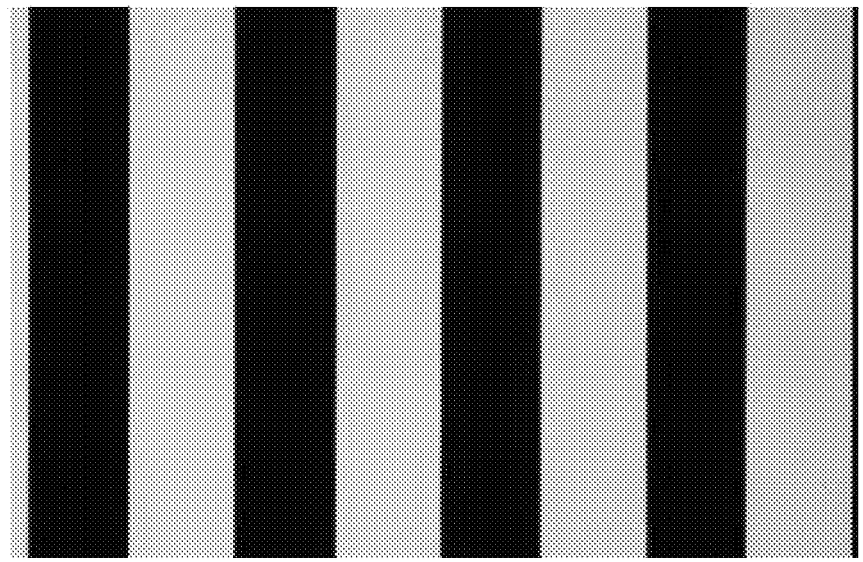
FIGS. 7A to 7D are photographs illustrating pattern forms according to an interval between a mask and a base film when a guide slit is formed.
Figure 7B:
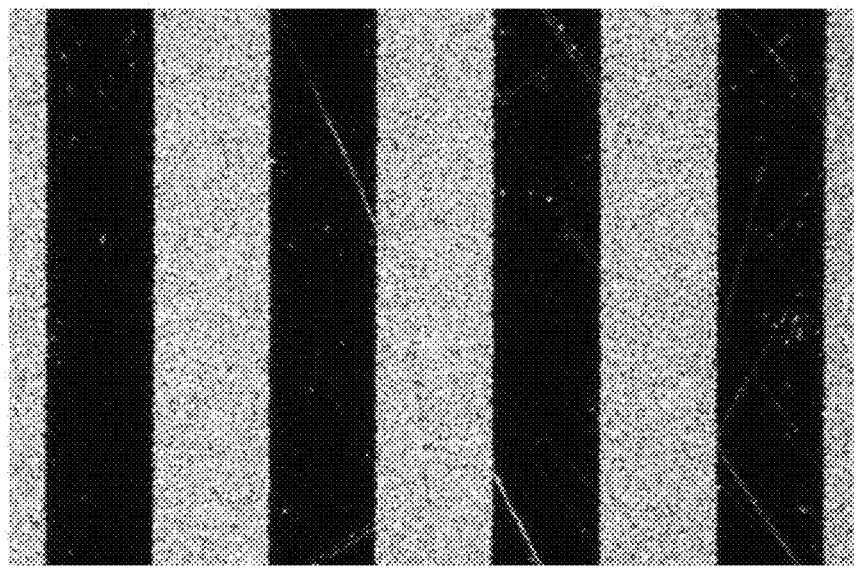
Figure 7C:
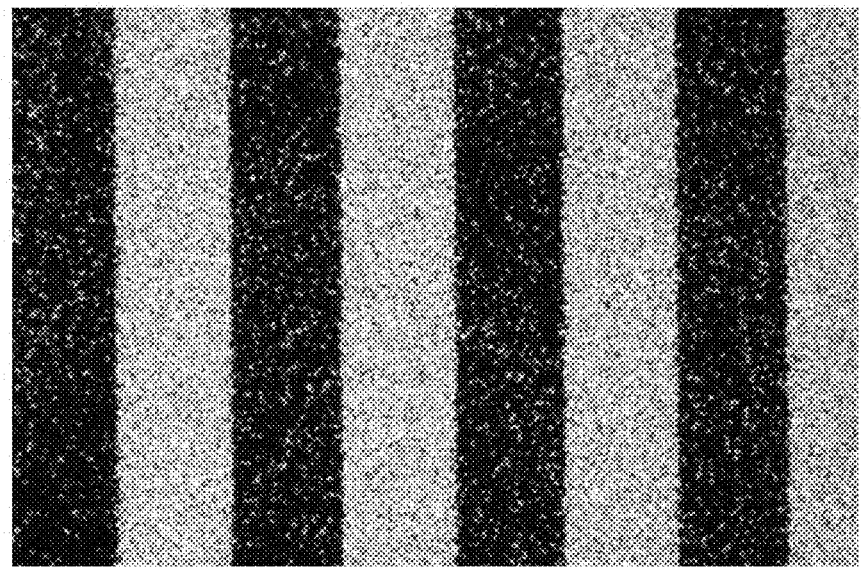
Figure 7D:
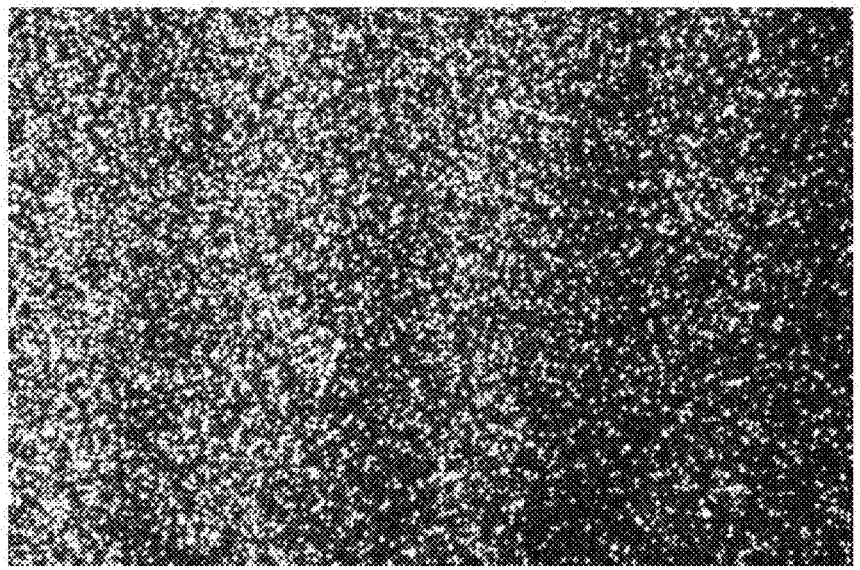

As can be seen from FIGS. 7A to 7D, as the interval between the mask 40 and the base film 50 decreases, a pattern is clearly and uniformly formed, where as the interval increases, a pattern is not normally formed. Further, it can be understood that a pattern almost disappears when the interval is excessively large (FIG. 7D).

According to Equation 2, as the interval a increases, the maximum deviation distance b increases. Thus, by reducing the interval a as much as possible, the maximum deviation distance b can be reduced, and thus a uniform pattern can be formed.

Figure 8:
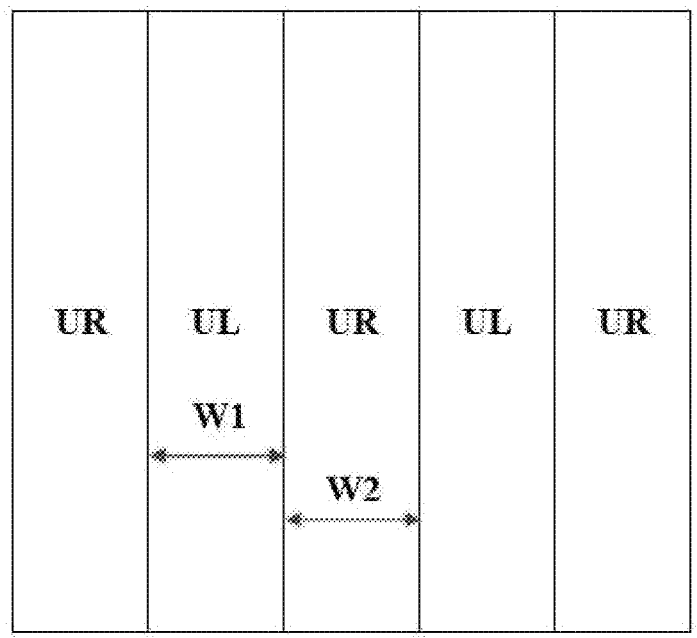
FIG. 8 illustrates a display panel of a stereoscopic video display device according to an exemplary embodiment of the present invention.

Further, the width w of the guide slit 42 can be designed to be equal to a pattern width of a stereoscopic video filter. For example, when an optical filter having a pattern formed using the mask 40 is an optical filter of a stereoscopic video display device, a pitch of the guide slit 42 may be twice the width of a unit pixel for generating a left eye video or a right eye video in a display panel of the stereoscopic video display device. As described above, for example, as illustrated in FIG. 8, unit pixels (UL) for generating a left eye video and unit pixels (UR) for generating a right eye video may be alternately arranged in a display panel in a stripe form. In this case, when the film of the present invention is used for an optical filter applied to the stereoscopic video display device, the pitch P is preferably equal to a value that is twice the width (W1 or W2 of FIG. 8) of a unit pixel (UL or UR).

In the present invention, "equal" means "substantially equal" within a range not damaging an effect of the present invention. For example, "equal" means that there may be an error in which a manufacturing error or a variation is considered. In other words, when the pitch is equal to a value that is twice the width of the unit pixel, it may have an error within about ±60 µm, preferably an error of within about ±40 µm, and more preferably an error of within about ±20 µm.

Further, an interval between the guide slits 42 preferably has a value equal to the width (for example, W1 or W2 of FIG. 8) of the unit pixel for generating a left eye video or a right eye video in the display panel of the stereoscopic video display device. The value equal to the width of the unit pixel means a value substantially equal to the width of the unit pixel and has an error within about ±30 µm, preferably an error of within about ±20 µm, and more preferably an error of within about ±10 µm. Using the mask 40 according to the present invention, since the interval is adjusted in the above described manner, it is possible to form an optical filter in which an alignment pattern is formed with a high degree of accuracy and a non-aligned area is minimized.

Further, the mask 40 according to the present invention may have a curved surface rather than a plane surface according to a curvature radius of a roll used in the roll-to-roll process. When the surface of the mask 40 facing the roll has a curved surface, an interval between the mask 40 and the roll can be maintained constant, and a uniform pattern can be formed on the base film 50. Further, the surface of the mask 40 facing the roll preferably has a curved surface having the same curvature radius as the roll.

Further, in order to improve straightness of light, in the mask 40 of the present invention, the shape of the guide slit 42 may change. For example, the guide slit 42 illustrated in FIG. 3 has inner walls formed in parallel to each other, but a guide slit may be formed to have a width that decreases downward.

Furthermore, the mask 40 of the present invention may be configured to have an inner wall coated with a material for total reflection of light so as to improve straightness of light.

According to the present invention, since a short arc type discharge lamp is used as a light source that emits straight light, a large area can be uniformly exposed to light, light parallelized with a high degree of accuracy can be irradiated, a uniform alignment characteristic can be given, and large-area optical alignment can be effectively performed.

Further, since a plurality of guide slits are formed in a mask, straightness of light is improved even in a state in which a mask is apart from a base film. Thus, pattern uniformity is excellent, a manufacturing process is simplified, and thus productivity and process efficiency are improved.

While the invention has been shown and described with reference to certain exemplary embodiments thereof, it will be understood by those skilled in the art that various changes in form and details may be made therein without departing from the purpose and scope of the invention as defined by the appended claims.

What is claimed is:

1. An optical filter manufacturing apparatus, comprising:
 a roll used in a roll-to-roll process;
 a base film wound around the roll;
 a light source that generates light for exposure;
 a polarizing plate that is installed at an emission side of the light source and polarizes light generated from the light source; and
 a mask that causes a pattern to be formed on the base film and includes a plurality of guide slits that are opened to have a predetermined thickness and a predetermined width,
 wherein surfaces of the mask and the base film facing each other are curved surfaces,
 wherein the width of the guide slit is the same as a unit pixel width of a stereoscopic video display device, and
 wherein the guide slit is designed to satisfy the following equation:

$$t \geq 5a$$

where t represents the thickness of the guide slit, a represents an interval between the mask and the base film, and 0<a≤50 mm.

2. The optical filter manufacturing apparatus according to claim 1, further comprising a light collecting plate that collects light to cause an entire area of the base film to be uniformly irradiated with light.

3. The optical filter manufacturing apparatus according to claim 1, wherein the light source includes a short arc type discharge lamp.

4. The optical filter manufacturing apparatus according to claim 1, wherein the light source includes an ultraviolet (UV) lamp, and a cooling device is installed between the UV lamp and the base film.

5. The optical filter manufacturing apparatus according to claim 1, wherein a plurality of light sources are arranged in plural rows such that the light sources arranged in different rows partially overlap each other.

6. The optical filter manufacturing apparatus according to claim 5, wherein the light sources arranged in different rows overlap each other by ⅔.

7. The optical filter manufacturing apparatus according to claim 1, wherein an inner wall of the guide slit has a width that decreases downward.

8. The optical filter manufacturing apparatus according to claim 1, wherein an inner wall of the guide slit is coated with a total reflection material so as to increase straightness of light.

9. The optical filter manufacturing apparatus according to claim 1, wherein the guide slits are arranged in plural rows at predetermined intervals.

10. The optical filter manufacturing apparatus according to —claim 1, wherein the guide slits are positioned in different rows and are alternately arranged.

* * * * *